(12) United States Patent
Sukachev et al.

(10) Patent No.: US 12,260,113 B1
(45) Date of Patent: Mar. 25, 2025

(54) PORTABLE QUANTUM MEMORY PACKAGE FOR QUANTUM NETWORK NODES

(71) Applicant: LIGHTSYNQ TECHNOLOGIES INC., Cambridge, MA (US)

(72) Inventors: Denis Sukachev, Brookline, MA (US); Bartholomeus Johannes Machielse, Somerville, MA (US); Mihir Keshav Bhaskar, Cambridge, MA (US); David Sarkis Levonian, Cambridge, MA (US)

(73) Assignee: Lightsynq Technologies Inc., Cambridge, MA (US)

( * ) Notice: Subject to any disclaimer, the term of this patent is extended or adjusted under 35 U.S.C. 154(b) by 261 days.

(21) Appl. No.: 17/810,288

(22) Filed: Jun. 30, 2022

(51) Int. Cl.
*G06N 10/40* (2022.01)
*G06F 3/06* (2006.01)

(52) U.S. Cl.
CPC .......... *G06F 3/0655* (2013.01); *G06F 3/0604* (2013.01); *G06F 3/0679* (2013.01); *G06N 10/40* (2022.01)

(58) Field of Classification Search
CPC ..... G06N 10/40; G06F 3/0655; G06F 3/0604; G06F 3/0679
See application file for complete search history.

(56) References Cited

U.S. PATENT DOCUMENTS

| | | | |
|---|---|---|---|
| 7,889,992 B1 | 2/2011 | DiVincenzo et al. | |
| 8,510,618 B1 * | 8/2013 | Pesetski | B82Y 10/00 714/746 |
| 9,111,229 B2 | 8/2015 | Harrison et al. | |
| 9,385,293 B1 * | 7/2016 | Nayfeh | H10N 60/12 |
| 10,038,729 B1 * | 7/2018 | Ramalingam | H04W 48/12 |
| 10,756,202 B2 | 8/2020 | Roberts et al. | |
| 11,011,693 B2 | 5/2021 | Lampert et al. | |

(Continued)

OTHER PUBLICATIONS

Editors of the American Heritage Dictionaries (Ed.). (2016). Device. In the American Heritage(R) Dictionary of the English Language (6th ed.). Houghton Mifflin. https://search.credoreference.com/articles/Qm9va0FydGljbGU6NDQwNTEyOA==?aid=279753.*

(Continued)

*Primary Examiner* — Tanya T Motsinger
(74) *Attorney, Agent, or Firm* — Dickinson Wright PLLC

(57) ABSTRACT

A packaged quantum memory device is described. The packaged quantum memory device comprises both quantum memories and quantum memory control devices within an outer package, such that the unit may be shipped, installed, and operated without opening the outer package to tune and/or operate the quantum memories. Optical and electrical control signals may be received from, or provided to, the internal components of the packaged quantum memory device via electrical and/or optical ports located on an outer package layer, and routed to the quantum memories via respective quantum memory control devices. Various electrical, optical, mechanical, and/or spin-related properties of the quantum memories may be tuned using the quantum memory control devices, as well as the local temperature and gas environments around the quantum memories. The packaged quantum memory device may be installed within a cryogenic cooling device, as a unit, and operated via the electrical and optical ports.

20 Claims, 10 Drawing Sheets

(56) References Cited

U.S. PATENT DOCUMENTS

| | | | | |
|---|---|---|---|---|
| 2004/0109633 A1* | 6/2004 | Pittman | ............... | B82Y 10/00 |
| | | | | 385/16 |
| 2004/0169200 A1* | 9/2004 | Ichimura | ............... | G06N 10/40 |
| | | | | 257/200 |
| 2011/0244268 A1* | 10/2011 | Sasaki | ............... | G01R 33/1284 |
| | | | | 428/812 |
| 2015/0380631 A1* | 12/2015 | Taylor | ............... | H10N 60/805 |
| | | | | 257/31 |
| 2018/0260245 A1* | 9/2018 | Smith | ............... | G06F 9/4881 |
| 2019/0207057 A1* | 7/2019 | Kang | ............... | H01L 33/0095 |
| 2021/0058162 A1* | 2/2021 | Kaplan | ............... | H04B 10/70 |
| 2021/0058163 A1* | 2/2021 | Reilly | ............... | H04L 9/0855 |
| 2021/0103847 A1 | 4/2021 | Akzam | | |
| 2021/0105135 A1* | 4/2021 | Figueroa | ............... | H04B 10/70 |
| 2022/0147596 A1* | 5/2022 | Susa | ............... | G06N 10/00 |
| 2022/0198023 A1* | 6/2022 | Gopinath | ............... | G06F 9/455 |
| 2022/0269974 A1* | 8/2022 | Bhaskar | ............... | G06N 10/70 |
| 2022/0292235 A1* | 9/2022 | Susa | ............... | G06F 17/11 |
| 2023/0084726 A1* | 3/2023 | Walsworth | ............... | G01N 33/389 |
| | | | | 324/304 |
| 2023/0110591 A1* | 4/2023 | Routt | ............... | G06F 15/16 |
| | | | | 706/12 |
| 2023/0208628 A1* | 6/2023 | Krastanov | ............... | H04L 9/0855 |
| | | | | 359/107 |
| 2023/0237359 A1* | 7/2023 | Rogers | ............... | G06N 10/20 |
| | | | | 706/62 |
| 2023/0314717 A1* | 10/2023 | Kudalippalliyalil | ... | G06N 10/40 |
| | | | | 385/27 |
| 2023/0376818 A1* | 11/2023 | Nowak | ............... | G06N 10/40 |
| 2024/0171198 A1* | 5/2024 | Bauer | ............... | G06N 10/40 |
| 2024/0183604 A1* | 6/2024 | Buckley | ............... | F25D 19/04 |
| 2024/0220840 A1* | 7/2024 | Jacob | ............... | G02F 1/353 |

OTHER PUBLICATIONS

Editors of the American Heritage Dictionaries (Ed.). (2016). Control. In the American Heritage(R) Dictionary of the English Language (6th ed.). Houghton Mifflin. https://search.credoreference.com/articles/Qm9va0FydGljbGU6NDQwMDU0Mg==?aid=279753.*

Editors of the American Heritage Dictionaries (Ed.). (2016). Enclosure. In the American Heritage(R) Dictionary of the English Language (6th ed.). Houghton Mifflin. https://search.credoreference.com/articles/Qm9va0FydGljbGU6NDQwOTMxMg==?aid=279753.*

Editors of the American Heritage Dictionaries (Ed.). (2016). Enclose. In the American Heritage(R) Dictionary of the English Language (6th ed.). Houghton Mifflin. https://search.credoreference.com/articles/Qm9va0FydGljbGU6NDQwOTMxMQ==?aid=279753.*

U.S. Appl. No. 17/548,254, filed Dec. 10, 2021, Mihir Keshav Bhaskar.

U.S. Appl. No. 17/58,418, filed Dec. 10, 2021, Mihir Keshav Bhaskar.

U.S. Appl. No. 17/548,422, filed Dec. 10, 2021, Antia Lamas Linares.

* cited by examiner

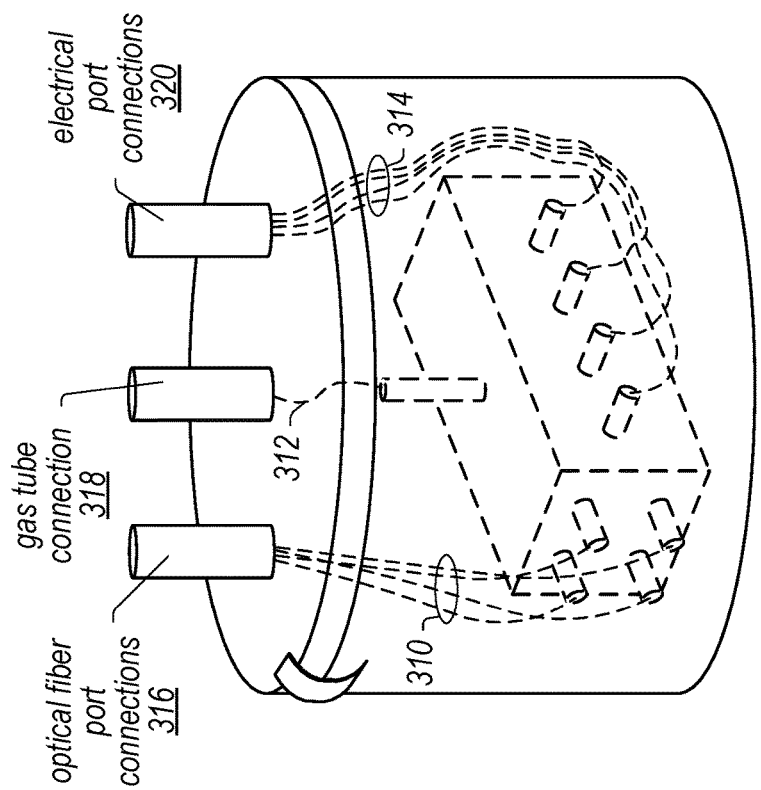
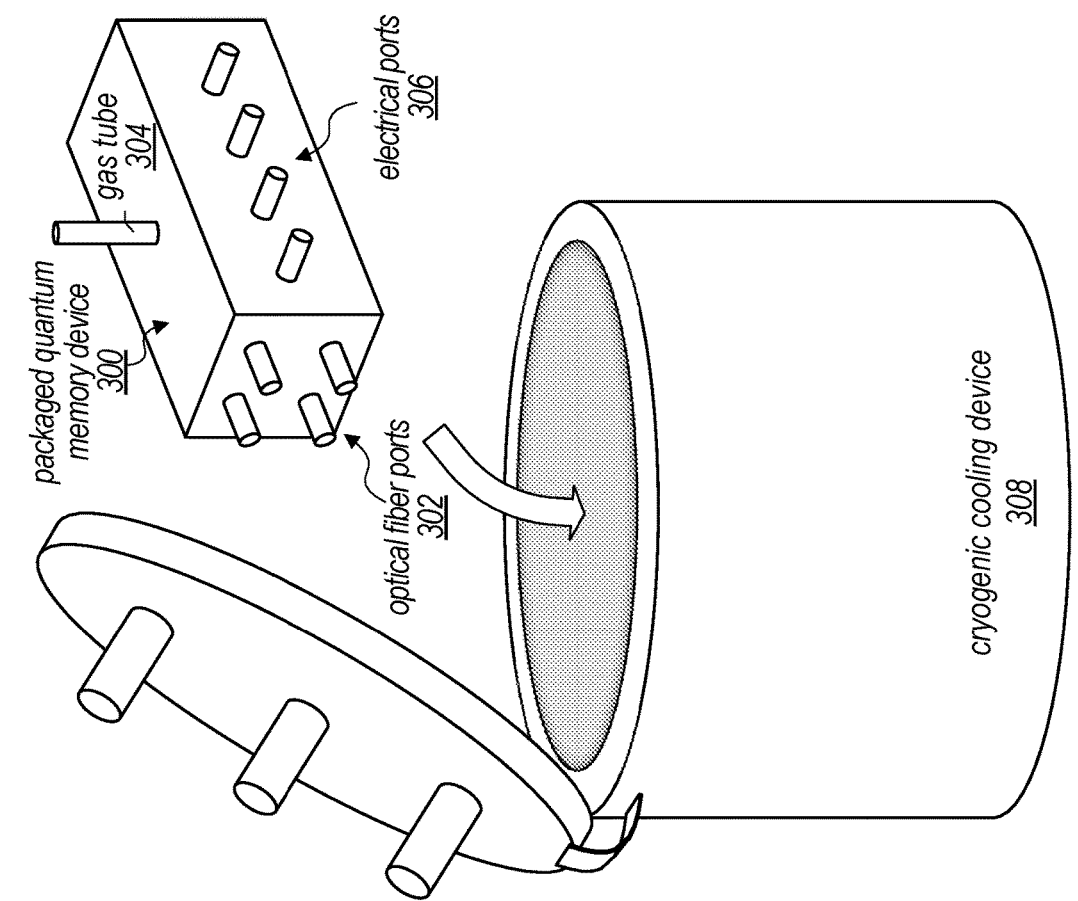
FIG. 3B
FIG. 3A

PORTABLE QUANTUM MEMORY PACKAGE FOR QUANTUM NETWORK NODES

BACKGROUND

Quantum computing utilizes the laws of quantum physics to process information. Quantum physics is a theory that describes the behavior of reality at the fundamental level. It is currently the only physical theory that is capable of consistently predicting the behavior of microscopic quantum objects (e.g., particles) like photons, molecules, atoms, and electrons.

A quantum computing device is a device that utilizes quantum mechanics to allow one to write, store, process and read out information encoded in quantum states, e.g., the states of quantum objects. A quantum object is a physical object that behaves according to the laws of quantum physics. The state of a physical object is a description of the object at a given time.

In quantum mechanics, the state of a two-level quantum system, or simply, a qubit, is a list of two complex numbers, where the sum of squared absolute values of the complex numbers (e.g., $|x|^2+|y|^2$) must sum to one. Each of the two complex numbers (e.g., x and y) is called an amplitude, and their respective quasi-probabilities are the squared absolute values of the complex numbers (e.g., $|x|^2$ and $|y|^2$, respectively). Hence, the square of the absolute value of each complex number corresponds to the probability of event zero or event one happening. A fundamental and counter-intuitive difference between a probabilistic bit (e.g., a traditional zero or one bit) and the qubit is that a probabilistic bit represents a lack of information about a two-level classical system, while a qubit contains maximal information about a two-level quantum system.

Quantum computing devices are based on such quantum bits (qubits), which may experience the phenomena of "superposition" and "entanglement." Superposition allows a quantum system to be in multiple states at the same time. For example, whereas a classical computer is based on bits that are either zero or one, a qubit may be both zero and one at the same time, with different probabilities assigned to zero and one. Entanglement is a strong correlation between quantum particles, such that the quantum particles are inextricably linked in unison even if separated by great distances.

There are different types of qubits that may be used in quantum computers, each having different advantages and disadvantages. For example, some quantum computers may include qubits built from superconductors, trapped ions, semiconductors, photons, etc. Each may experience different levels of interference, errors and decoherence. Also, some may be more useful for generating particular types of quantum circuits or quantum algorithms, while others may be more useful for generating other types of quantum circuits or quantum algorithms.

BRIEF DESCRIPTION OF THE DRAWINGS

FIGS. 3A and 3B illustrate an example process of the installation of a packaged quantum memory device, such as a quantum repeater, into a cryogenic cooling device, according to some embodiments.

Figure 1A:
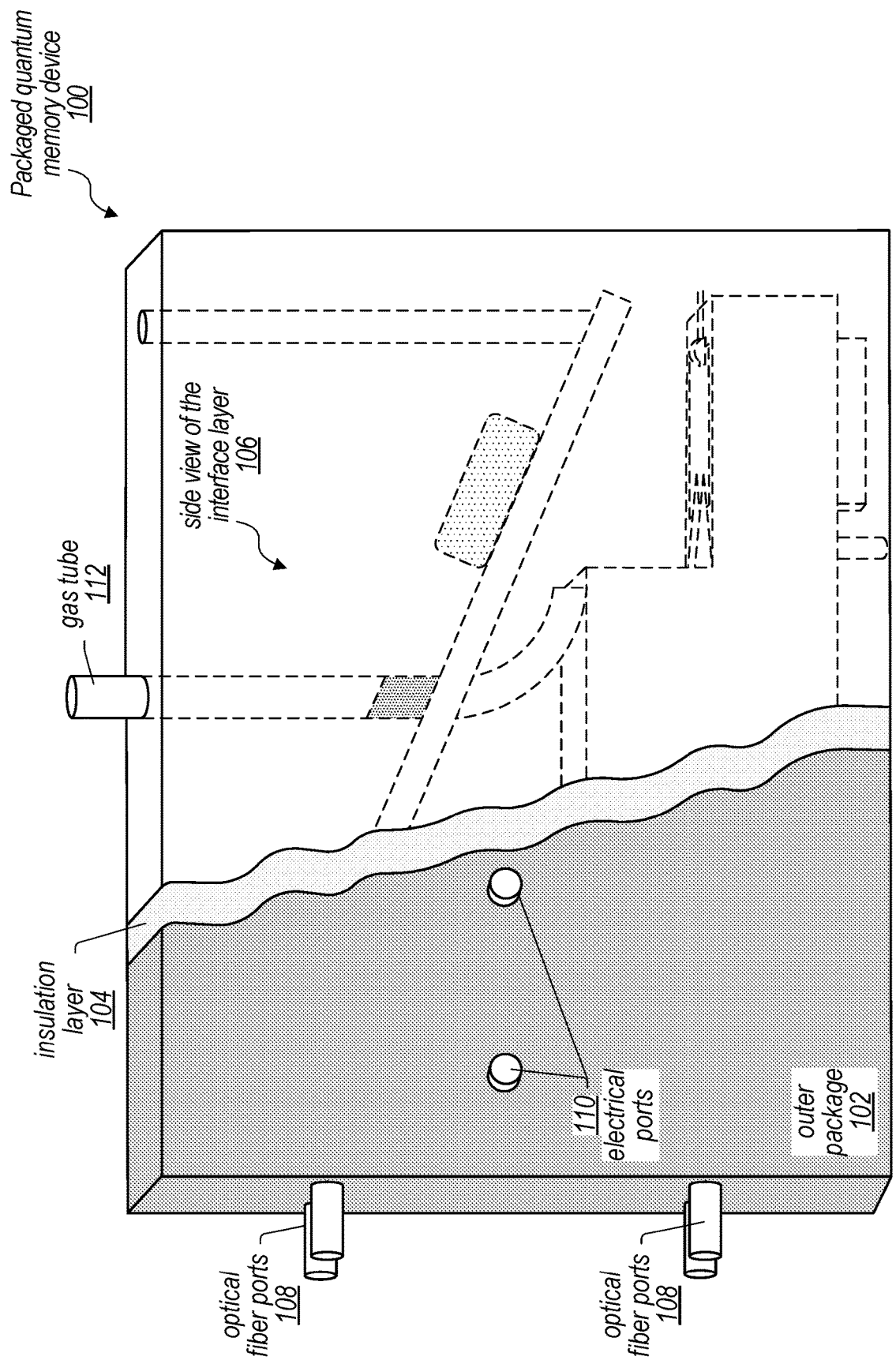
FIG. 1A illustrates an example of a packaged quantum memory device, such as a quantum repeater, with quantum memories and quantum memory control devices enclosed within an outer package, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to. When used in the claims, the term "or" is used as an inclusive or and not as an exclusive or. For example, the phrase "at least one of x, y, or z" means any one of x, y, and z, as well as any combination thereof.

DETAILED DESCRIPTION

The present disclosure relates to methods and systems for implementing a quantum memory device, such as a quantum repeater, as an integrated, transportable package comprising quantum memories and quantum memory control devices included in a self-contained, packaged unit.

Quantum memories provide a method of receiving, storing, and providing quantum information. In some cases, quantum memories may be deployed for use in large-scale optical fiber networks and/or quantum entanglement networks, for example as quantum repeaters, that store and effectively connect distributed entangled particles to provide secure, long-distance communications. In such applications, as an example, there is a need for reliable, robust, and shippable units that can operate and control the tuning of quantum memories housed within the shippable units. In some embodiments, a packaged quantum memory device is configured as a self-contained shippable unit that is pre-assembled and pre-calibrated. For example, such packaged quantum memory devices (e.g. quantum repeater units) may be installed within cryogenic cooling devices without the need for engineers or technicians with specialized quantum memory knowledge to perform additional assembly or calibration. Optical fiber and electrical ports on an outer layer of such a quantum memory device package may allow an end-user to connect external inputs, outputs, and/or control computers to quantum memory control devices within the self-contained packaged quantum memory device (e.g. quantum repeater) and tune properties of the quantum memories included inside the package without the need to open the package and/or without the need to make internal alignments or adjustments.

In some embodiments, such self-contained packaged quantum memory devices (e.g. quantum repeaters) may include quantum memories and an interface layer, wherein the interface layer is configured to provide electrical, optical, and electromechanical control interfaces between cables or pathways accessible from the exterior of the package (e.g. electrical ports, optical ports, gas tube connections, etc.) and the quantum memories, along with providing an interface for tuning the quantum memories. For example, tuning may be performed via a quantum interface layer via adjustments to the flow of gas and/or localized heating applied to the quantum memories, the adjustment of strain applied to a wafer substrate housing the quantum memories, the adjustment of a magnetic field intersecting the quantum memories, and/or via other tuning mechanisms. The quantum memories and interface layer may be contained within an outer package that contains electrical and optical fiber ports for input/output interfaces to the quantum memories. The outer package may also include an insulation layer, which provides thermal insulation and protects the internal components from stray magnetic and/or electric fields.

FIG. 1A illustrates an example of a packaged quantum memory device, such as a quantum repeater, with quantum memories and quantum memory control devices enclosed within an outer package, according to some embodiments.

In some embodiments, a packaged quantum memory device, such as packaged quantum memory device 100, may comprise quantum memories and quantum memory control devices that are enclosed within packaged quantum memory device 100 by outer package 102. Note that for ease of illustration, some embodiments of the following description are given in terms of packaged quantum memory device 100 resembling a quantum repeater. However, in some embodiments, a packaged quantum memory device, as described herein in the figures, may be used for other purposes, such as storing quantum information locally at a given location. For example, in some situations, packaged quantum memory device 100 may be used to store quantum information (such as in a cache) that is used by multiple locally situated quantum computers.

The placements and interactions of the quantum memories and quantum memory control devices within packaged quantum memory device 100 may resemble embodiments of the interface layer shown in FIG. 1A, wherein a side view of the interface layer 106 is shown. Further description of the interface layer is also provided in FIG. 1B, described herein.

In some embodiments, outer package 102 may be structurally configured to maintain and stabilize environmental conditions within outer package 102 that may be different from the atmospheric conditions outside of outer package 102 (e.g., outer package 102 is structurally configured to provide atmospheric insulation). For example, outer package 102 may be pressurized with gas such that the gas does not escape from within outer package 102 to the outside atmosphere and such that the given environment within outer package 102 is stabilized with a higher pressure than the atmospheric pressure of the outside environment. In another example, outer package 102 may be configured to hold a vacuum state such that the given environment within outer package 102 is stabilized with a lower pressure than the atmospheric pressure of the outside environment. Outer package 102 may also provide insulation to the components within outer package 102 with insulation layer 104, according to some embodiments. Insulation layer 104 may provide thermal insulation to the components enclosed within outer package 102 such that a given temperature may be maintained (e.g., within a given acceptable threshold) within outer package 102. In such embodiments, the temperature within insulation layer 104 may be hotter or colder than the outside environment temperature.

Insulation layer 104 may also be configured to shield the components enclosed within outer package from stray magnetic and/or electric fields (e.g., RF signals) coming from the environment (e.g., outside of outer package 102), according to some embodiments. In some embodiments, packaged quantum memory device 100 may generate magnetic fields and/or electric fields (e.g., via the use of magnet 124), and insulation layer 104 may additionally be configured to contain such magnetic and/or electric fields internally within outer package 102, such that other devices nearby (e.g., other packaged quantum memory devices) are not influenced by these magnetic and/or electric fields and such that the other devices do not influence (or minimally influence) conditions within the outer package 102.

In some embodiments, packaged quantum memory device 100 may additionally include optical fiber ports 108 and electrical ports 110 on outer package 102 that provide interfaces between interface layer 106 and electrical and optical connectors (e.g., wires, cables, optical fiber cables, etc.) external to packaged quantum memory device 100. Optical fiber ports 108 and electrical ports 110 may be configured such that optical and electrical signals may be routed between devices external to outer package 102 and components of interface layer 106 (e.g., the example inputs and outputs shown in FIG. 4). It should be understood by someone having ordinary skill in the art that there may be more or fewer optical fiber ports 108 and/or electrical ports 110 than those shown as examples in the embodiments illustrated in FIG. 1A, and that their placements on outer package 102 may be moved depending upon dimensions of different configurations of interface layer 106.

Packaged quantum memory device 100 may additionally have a gas tube, such as gas tube 112, which may provide an interface for packaged quantum memory device 100 to flow gas into or out of outer package 102. Gas tube 112 may be configured to pump gas into and out of packaged quantum memory device 100, in addition to creating a vacuum environment (e.g. internal pressure less than ambient pressure) within outer package 102 when connected to a vacuum pump, which may cause gas to flow out of packaged quantum memory device 100 (e.g. out of outer package 102), according to some embodiments.

Figure 1B:
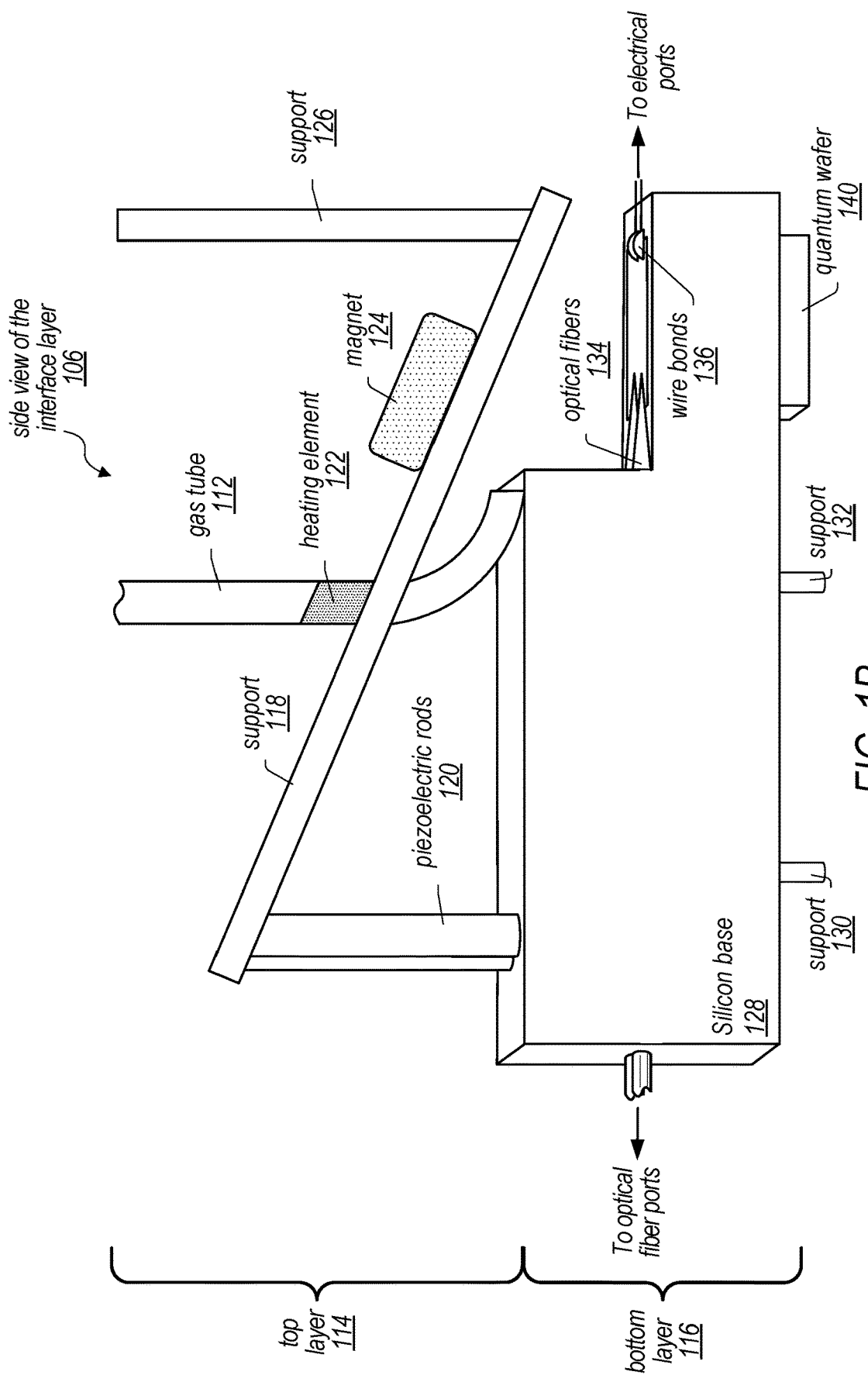
FIG. 1B illustrates a side view of the interface layer of the packaged quantum memory device, according to some embodiments.

FIG. 1B illustrates a side view of the interface layer of the packaged quantum memory device, according to some embodiments.

As shown in FIG. 1B, both the interface and quantum memory layers of packaged quantum memory device 100 may be housed within outer package 102. In some embodiments, interface layer 106 may include quantum memory control devices, such as those described in the following paragraphs, which control and modify the properties of, or conditions experienced by, the quantum memory layer. The quantum memory layer, such as quantum wafer 140, may include the quantum memories of packaged quantum memory device 100. The functionalities of quantum wafer 140 are further described in at least FIG. 1C and FIG. 2 herein.

Figure 1C:
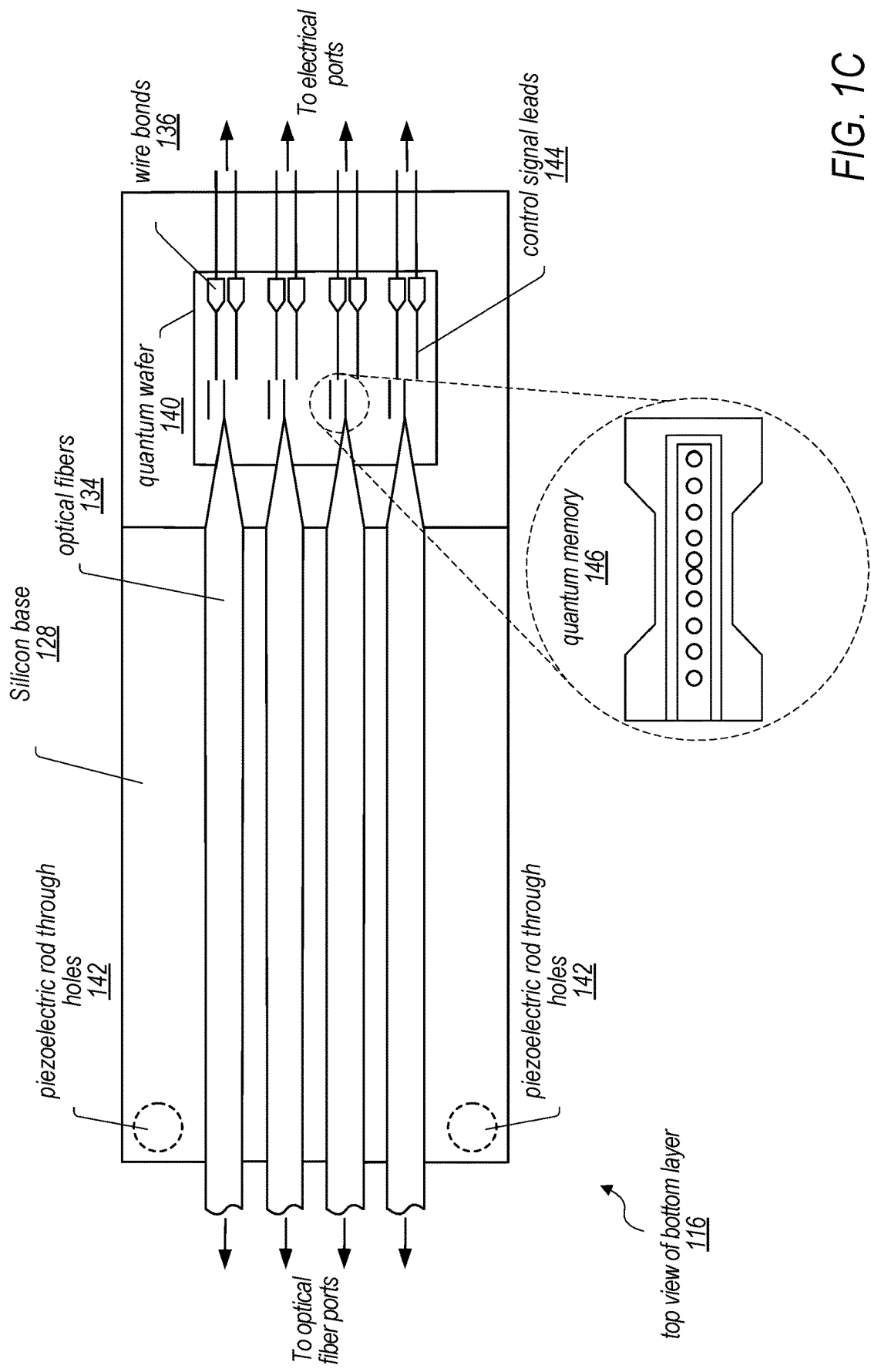
FIG. 1C illustrates a top view of the bottom portion of the interface layer of the packaged quantum memory device, according to some embodiments.
Figure 1D:
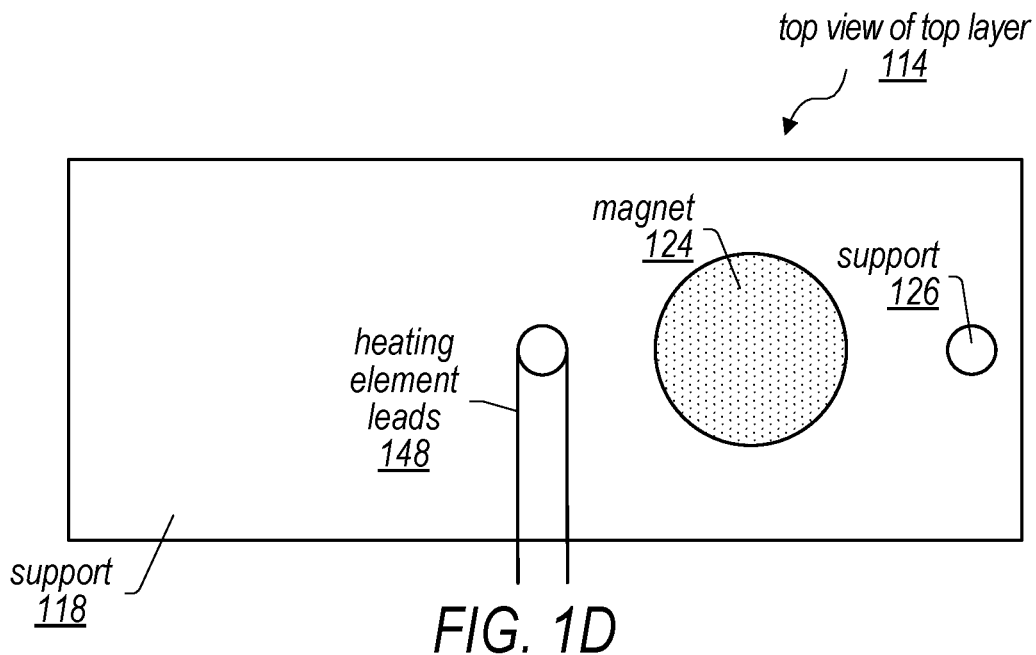
FIG. 1D illustrates a top view of the top portion of the interface layer of the packaged quantum memory device, according to some embodiments.

For ease of discussion herein, interface layer 106 may be referred to as having a top layer, such as top layer 114, and a bottom layer, such as bottom layer 116. A top view of bottom layer 116 is shown in FIG. 1C and a top view of top layer 114 is shown in FIG. 1D. Top layer 114 may provide a magnetic field and a gas tuning mechanism for quantum wafer 140, which is further explained in the following paragraphs. Bottom layer 116 may provide routing of optical fibers 134 to quantum wafer 140, routing of optical and electrical control signals to quantum wafer 140, and houses quantum wafer 140 within silicon base 128, which is also further explained in the following paragraphs.

In some embodiments of packaged quantum memory device 100, interface layer 106 may be used to control quantum wafer 140 using one or more quantum memory control devices. The quantum memory control devices may, for example, provide mechanisms for receiving and routing quantum information (e.g., entangled particles) to be stored in the quantum memories of quantum wafer 140. In another example, the quantum memory control devices may provide mechanisms for receiving, sending, emitting, and/or controlling optical and/or electrical control signals to, or from, the quantum memory layer. In yet another example, the quantum memory control devices may modify the behavior of the quantum memories via the use of low-frequency control signals (e.g., microwave, RF, and/or DC control signals) that may induce strain on the quantum memories in quantum wafer 140. The quantum memory control devices may additionally control heat flow onto quantum wafer 140 via heating coils, such as heating element 122 that heats gas flowing through gas tube 112. Quantum memory control devices of interface layer 106 may also be used to deliver electrical control signals that result in the creation of local electromechanical strain fields near the quantum memories of quantum wafer 140, according to some embodiments. Such electromechanical strain fields may, for example, enable for the tuning of optical and/or spin properties of quantum memories on quantum wafer 140 for improved performance and operation of said quantum memories. This may be referred to as strain tuning of the quantum memories, according to some embodiments.

In some embodiments, gas may be configured to flow within outer package 102 via gas tube 112. The flow of gas may be turned off and on, and/or moderated with valves on gas tube 112. The gas may also be heated using heating element 122, which may be controlled by electrical signals (e.g., electrical control signal inputs 420 and electrical control signal outputs 418) connected to heating element 122 via heating element leads 148. For example, electrical outputs from packaged quantum memory device 100 may be provided to a control computer that may generate the electrical control signal inputs used to control the heating. In some embodiments, gas tube 112 may be attached to a gas tank that is external to packaged quantum memory device 100. In other embodiments, a small reservoir of gas may be stored within packaged quantum memory device 100, which may be controlled via valves, electrical control signals, etc., such that gas may flow within outer package 102. Gas tube 112 may also be used to create a vacuum environment within outer package 102, and/or reduce the amount of gas within outer package 102 by reversing a flow of gas through gas tube 112, according to some embodiments.

In some embodiments, bottom layer 116 may include a base material, such as silicon base 128, onto which quantum wafer 140 may attach. In some embodiments, as shown in FIG. 1B, the base material is silicon. However, it should be understood by a person having ordinary skill in the art that the base material could be another material that provides similar functionalities as silicon base 128 (e.g., another semiconducting material). Silicon base 128 may be attached to supports 130 and 132, and to piezoelectric rods 120, according to some embodiments.

In some embodiments, optical fibers, such as optical fibers 134, may be inserted into grooves or through-holes embedded inside silicon base 128. Such grooves are also shown in FIG. 1C. As shown in FIG. 1B, optical fibers 134 may be coupled to quantum wafer 140 and to optical fiber ports 108. Silicon base 128 may house several rows of optical fibers, according to the depth of silicon base 128, that are fit into grooves. In some embodiments, respective rows of optical fibers 134 are coupled to quantum wafer 140 and to optical fiber ports 108. Additionally, in some embodiments, respective rows of optical fiber ports 108 may be present on outer package 102 (e.g., in addition to those shown in FIG. 1A), according to these configurations of silicon base 128. Silicon base 128 may also be bonded (e.g., soldered) to quantum wafer 140 (e.g., via indium bumps). In some embodiments, optical fibers 134 may be referred to as "tapered" optical fibers due to their needle-point shape, as shown in FIG. 1B.

In some embodiments, wire bonds, such as wire bonds 136 (e.g., soldering points), may be used to connect control signal leads 144 to electrical ports 110. Functionalities of wire bonds 136 are further discussed in at least the description of FIG. 1C herein.

In some embodiments, electrical control signals, such as microwave or RF frequency control signals, may be used to control the state (e.g., state change) of a given quantum memory. In some embodiments in which the quantum memories on quantum wafer 140 are nanophotonic cavities (e.g., quantum memory 200), DC or low-frequency AC electric fields may be used to tune the color center resonances of such nanophotonic cavities. In some embodiments, such electrical control signals may also be configured such that cross talk and excess heating of the quantum memories on quantum wafer 140 may be avoided.

In some embodiments, electrical control signals, such as DC, RF, and/or microwave signals, may be delivered to the quantum memories of quantum wafer 140 via micro-patterned electrical lines (e.g., coplanar waveguides, capacitors, etc. that may be made of semiconducting and/or superconducting materials) on both silicon base 128 and quantum wafer 140.

In some embodiments, magnet 124 may be used to produce a magnetic field in the local environment of quantum wafer 140. In some embodiments, magnet 124 may be configured such that a local tuning of the magnetic field is enabled, and local tuning of individual quantum memory alignments and/or strain may be controlled. Magnet 124 may resemble a permanent magnet which may be mechanically attached to support 118. A procedure for attaching the permanent magnet to support 118 may be included in the assembly process of packaged quantum memory device 100, as special care may be taken to align the directionality of the magnetic field of magnet 124 for precise operation of the quantum memories on quantum wafer 140. Calibration of magnet 124 may take place during assembly of packaged quantum memory device 100 and/or during installation of packaged quantum memory device 100 in a destination location (e.g., via the processes described by blocks 602, 604, and 606). In some embodiments, support 118 may resemble a translation stage that enables finetuning of the magnetic field for operation of the quantum memories on quantum wafer 140. In some embodiments, additional electromagnets may be provided on quantum wafer 140 (e.g., small, "on-chip" electromagnets), in addition to magnet 124 on support 118, in order to finetune the magnetic field. Such "on-chip" electromagnets may be patterned onto quantum wafer 140 via photolithography and/or electron beam lithography.

In some embodiments, support 118 may resemble a magnet-holding layer that is mounted above quantum wafer 140. In such embodiments, piezoelectric rods 120 may be attached to support 118, and piezoelectric rods 120 may be controlled based on electrical control signals (e.g., electrical control signal inputs 420 and electrical control signal outputs 418) such that they expand and/or contract, causing the position and/or orientation of magnet 124 to be adjusted such that the local magnetic field near the quantum memories on quantum wafer 140 may be tuned.

In some embodiments, supports 126, 130, and 132 may be used to anchor packaged quantum memory device 100 into outer package 102. Supports 126, 130, and 132 may be shock-absorbing and/or have other mechanical functionalities so as to prevent damage to the components within packaged quantum memory device 100 (e.g., during transportation and installation of packaged quantum memory device 100 as a self-contained unit). In addition, supports 126, 130, and 132 may also be thermally conductive such that silicon base 128 and support 118 may be thermalized to outer package 102 (e.g., a closer thermal equilibrium between interface layer 106 and outer package 102).

FIG. 1C illustrates a top view of the bottom portion of the interface layer of the packaged quantum memory device, according to some embodiments.

In some embodiments, bottom layer 116 (as shown in the top view of the bottom layer) may comprise optical fibers 134 embedded into silicon base 128 and quantum wafer 140 attached to silicon base 128, for example as shown in FIG. 1C. Through holes 142 for piezoelectric rods 120 may be made such that the position and orientation of magnet 124 may be adjusted, relative to silicon base 128, for example for tuning of the quantum memories on quantum wafer 140, according to some embodiments. In addition, optical fibers 134 may be coupled to quantum memories of quantum wafer 140, such as quantum memory 146, via a process of gluing and/or melting the tapered ends of the optical fibers to respective quantum memories. In some embodiments, such quantum fiber attachment processes may allow for the coupling between the optical fibers and the quantum memories to withstand thermal expansion and/or thermal gradients when packaged quantum memory device 100 is placed within a cryogenic cooling device and cooled to cryogenic temperatures (e.g., as described in the installation of packaged quantum memory device 300 into cryogenic cooling device 308, shown in FIGS. 3A and 3B herein). Such embodiments may be advantageous not only for the durability and reliability of packaged quantum memory device 100 during and after transportation to a destination location (e.g., in such embodiments in which packaged quantum memory device 100 may be a quantum repeater and may be transported and installed as a quantum network node for quantum entanglement distribution), but also because proper alignment and coupling of the optical fibers to the quantum memories helps avoid a substantial realignment, via the re-opening of outer package 102, after transportation and/or the cool down to cryogenic temperatures.

Figure 2:
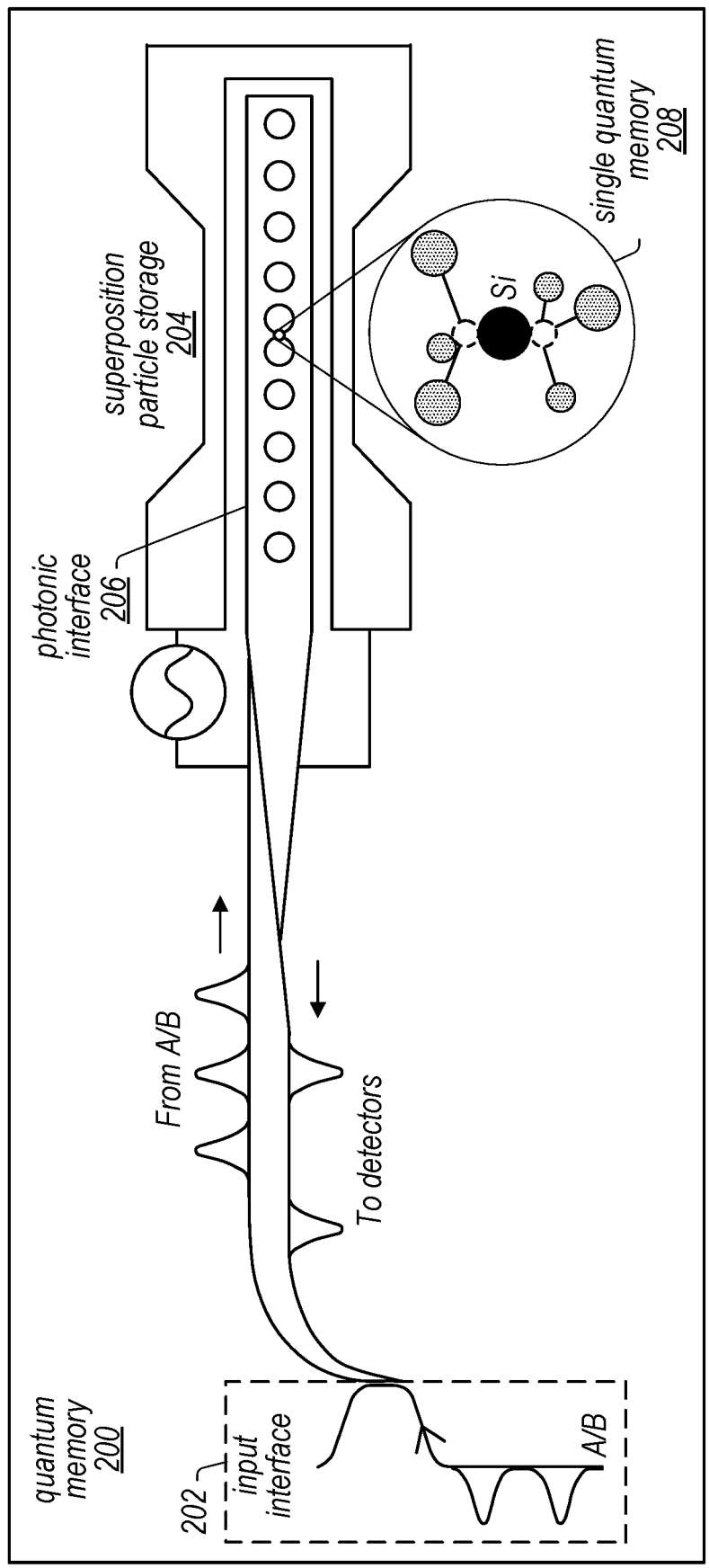
FIG. 2 illustrates an example of a quantum memory for a packaged quantum memory device, such as a quantum repeater, according to some embodiments.

In some embodiments, quantum memories on quantum wafer 140 may resemble quantum memory 146, which is further described in FIG. 2. Quantum wafer 140 may comprise a "host material" for quantum memories, and may be micro-patterned for electrical lines that allow electrical control signals to reach the quantum memories, according to some embodiments. The materials chosen for quantum wafer 140 may vary based on the type of quantum memory it hosts. For example, quantum wafer 140 may resemble a nanophotonic crystal interface for a type of quantum memory such as a diamond SiV color center. However, quantum wafer 140 may resemble any nanophotonic cavity (e.g., nanophotonic crystal cavities, ring resonators, plasmonic cavities, etc.) or Fabry Perot cavity that provides an optical interface for quantum memories of packaged quantum memory device 100, when used to house other types of quantum memories. The nanophotonic cavities may be attached to a variety of substrates, such as diamond, LiNbO, or silicon.

Similarly, quantum memory 146 may resemble a solid state quantum memory, such as diamond, silicon, silicon nitride, lithium niobate, other color centers in diamond, rare earth ions, etc., that may be embedded into nanophotonic cavities. Quantum memory 146 may also resemble a trapped free-space atomic and/or ionic quantum memory (e.g., laser trapped rubidium atoms). Quantum memory 146 may further resemble an ensemble quantum memory (rare earth vapors). In some embodiments, the combination of the "host material" of quantum wafer 140 that is chosen and the type of quantum memory that is chosen for quantum memory 146 may allow for the control of properties of the entangled particles within said quantum memories via electrical, optical, mechanical control signals.

Once the type of nanophotonic cavity is chosen, quantum memory control devices of interface layer 106 may be used to match the frequency of the nanophotonic cavity to the given quantum emitter (e.g., entangled particle source). For example, the quantum memory control devices may be used to perform optical tuning (e.g., refractive index shift), electromechanical deformation tuning (e.g., via piezoelectric rods 120), and/or gas (e.g., $N_2$ gas) deposition tuning (e.g., via gas tube 112 and/or heating element 122) onto the nanophotonic cavities. In addition, control signal leads 144 may provide electrical control signals to, and/or from, the quantum memories and may be attached to quantum wafer 134 via wire bonds 136.

FIG. 1D illustrates a top view of the top portion of the interface layer of the packaged quantum memory device, according to some embodiments.

FIG. 1D may represent another perspective of interface layer 106, taken as a top view of top layer 114. Additional perspectives of support 118, magnet 124, and support 126 have been shown above in FIG. 1B. In addition, heating element leads 148 may resemble wires/cables that connect to heating element 122 and to electrical ports 110. Heating element leads 148 may be used to couple electrical control signal(s) to heating element 122 (e.g., electrical control signals such as electrical control signal outputs 418 and/or electrical control signal inputs 420, described in FIG. 4) such that heating element 122 may be manipulated according to the configurations and functionalities needed for packaged quantum memory device 100.

Figure 1E:
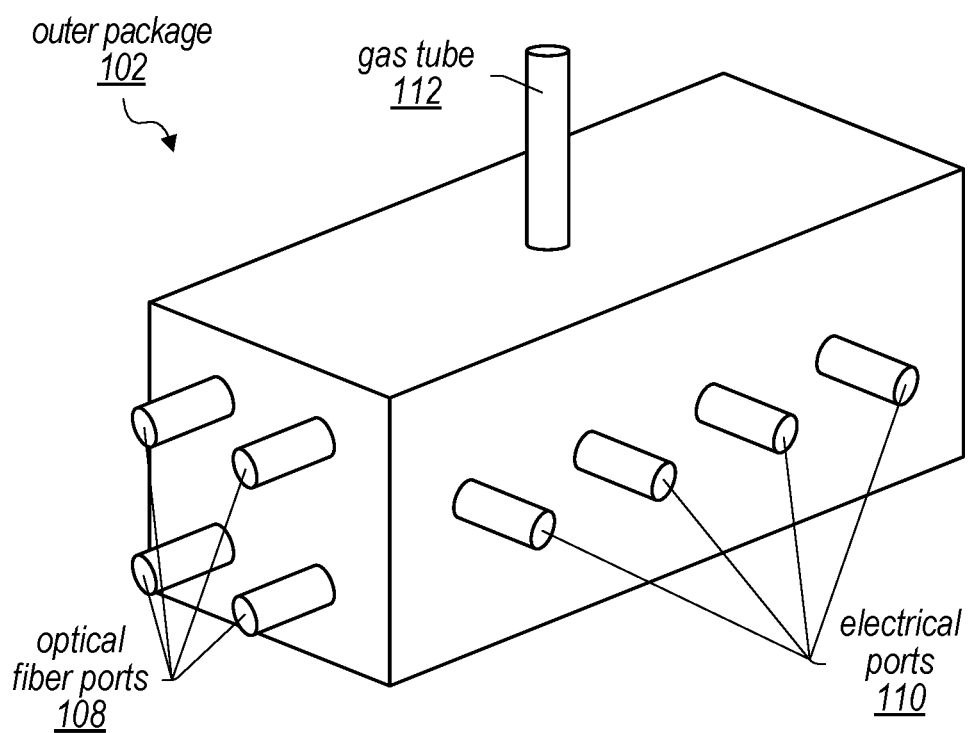
FIG. 1E illustrates the gas tube, optical ports, and electrical ports of the outer package, according to some embodiments.

FIG. 1E illustrates the gas tube, optical ports, and electrical ports of the outer package, according to some embodiments.

FIG. 1E may represent another view of packaged quantum memory device 100, with outer package 102, optical fiber ports 108, electrical ports 110, and gas tube 112, all of which have been described above and are described in more detail below with regard to FIG. 4.

FIG. 2 illustrates an example of a quantum memory for a packaged quantum memory device, such as a quantum repeater, according to some embodiments.

In some embodiments, quantum memories on quantum wafer 140 may resemble quantum memory 200. Quantum memory 200 may include an input interface 202 that receives photons in a superposition state (e.g., via optical fibers 134) to superposition particle storage 204, which may, in some embodiments, include a photonic interface 206 comprising single quantum memories, such as single quantum memory 208. In some embodiments, superposition particle storage 204 may resemble a nanophotonic cavity. In some embodiments, as shown in FIG. 2, single quantum memory 208 illustrates a silicon vacancy in diamond structure. Though in some embodiments, other structures, such as nitrogen-vacancy in diamond, trapped atoms, ensemble doped crystals, atomic vapors, silicon carbide emitters, single rare earth dopants, trapped ions, superconducting qubits, quantum dots in gallium arsenide, defect centers in silicon or other semiconducting materials, etc., may be used.

In some embodiments wherein packaged quantum memory device 100 may resemble a quantum repeater (e.g., for use as a quantum network node for quantum entanglement distribution), quantum memory 200 may be configured to store a first received entangled particle of a first pair of entangled particles in a first single quantum memory 208 of photonic interface 206 of superposition particle storage 204 and also store a second received entangled particle of a second pair of entangled particles in a second single quantum memory 208 of photonic interface 206 of superposition particle storage 204. Quantum memory 200 (or a quantum measurement device connected to quantum memory 200 either inside or outside of the package) may further be configured to perform one or more joint measurements on the first and second particles without collapsing superposition states of the first and second entangled particles. The joint measurements may determine a correlation relationship between the superposition states of the entangled particles such that entanglement can be extended between the pairs of entangle particles. Alternatively, quantum memory 200 may be configured to provide the first and second particles to a quantum measurement device located externally to packaged quantum memory device 100, such as quantum measurement device 414, via optical fibers 134 and optical fiber ports 108. Such methods and processes of storing and providing entangled particles using quantum memory 200 may also be described using blocks 700 and 702 of FIG. 7, according to some embodiments.

In some embodiments, quantum memory 200 may be heralded, meaning that when a particle arrives and is stored in a single quantum memory 208, the quantum measurement device (or other device of quantum memory 200) issues a heralding signal announcing the arrival of the particle. In some embodiments, such a heralding signal may be issued via optical fibers 134, and may be used to operate an optical switch to align the switch such that the quantum memory receives a next particle from an entangled particle source with which quantum entanglement is to be distributed. Furthermore, when the second particle arrives at quantum memory 200 from the entangled particle source, a second heralding signal may be issued. The second heralding signal may then cause joint measurements to be performed (e.g., at quantum measurement device 414) on the first and second particles stored in quantum memory 200. Furthermore, the joint measurements may extend the entanglement. In some embodiments, quantum measurement device 414 may perform heralding measurements and joint measurements, or in some embodiments, different quantum measurements devices 414 may be used to perform heralding measurements and joint measurements on received particle pairs. In some embodiments, the heralding function may be performed by a quantum non-destruction measuring device that can detect a particle (e.g., photon) entering quantum memory 200 without causing the particle to be collapsed out of the superposition state.

In some embodiments, quantum memory 200 may further include a conversion interface. For example, in some embodiments, the conversion interface may convert a transmission frequency of a received particle to a different frequency. For example, in some embodiments, fiber optical links (e.g., optical fibers 134) may transmit particles using different frequency wavelengths and such variations may be adjusted via a conversion interface of quantum memory 200. In some embodiments, the conversion interface may be located proximate to quantum memory 200, but may not necessarily be included in quantum memory 200. As another example, particles received at packaged quantum memory device 100 via optical ground stations and/or particles received at packaged quantum memory device 100 via fiber links may be transmitted at different wavelengths and a conversion interface of packaged quantum memory device 100 may convert the wavelength of the received particles to a wavelength used by quantum memory 200 to store quantum particles.

In some embodiments, quantum memory 200 (or sets of quantum memories) may store redundant sets of particles for use in generating quantum entanglement that is to be distributed. In such embodiments, error correction may be performed by comparing joint measurement results for multiple sets of particles. Such error correction may function as entanglement purification, in some embodiments. Also, parties at the endpoints connected via the redundantly distributed quantum entanglement may perform error correction.

FIGS. 3A and 3B illustrate an example process of the installation of a packaged quantum memory device, such as a quantum repeater, into a cryogenic cooling device, according to some embodiments.

In some embodiments, one or more packaged quantum memory devices, such as packaged quantum memory device 300, may be installed in a cryogenic cooling device, such as cryogenic cooling device 308. Cryogenic cooling device 308 may resemble a dilution refrigerator, cryogenic refrigerator, cryogenic cooling element, cryogenic cooler, and/or any system that may cool down to and maintain cryogenic temperatures over a period of time, according to some embodiments. It should be understood by someone having ordinary skill in the art that cryogenic cooling device 308 is configured to operate at different temperatures and/or within different temperature ranges, such as within cryogenic temperature ranges and within higher temperature ranges (e.g., approximately room temperature, above room temperature, etc.), and is additionally able to stabilize at any given temperature within a given temperature range. As shown in FIG. 3B, packaged quantum memory device 300 may be completely enclosed within cryogenic cooling device 308 as part of an installation process at a destination location (e.g., wherein the destination location may be a location of a quantum network node for a quantum entanglement distribution service).

In some embodiments, installation of packaged quantum memory device 300 into cryogenic cooling device 308 may include coupling optical fiber and electrical connectors to respective optical fiber and electrical ports of packaged quantum memory device 300, such as optical fiber ports 302 and electrical ports 306. Installation of packaged quantum memory device 300 into cryogenic cooling device 308 may additionally include routing a gas tube, such as gas tube 304, to and/or through a gas tube connection, according to some embodiments.

For example, electrical wires/cables, such as those shown in 314, may be connected to electrical ports 306 and to electrical port connections 320. In some embodiments, electrical port connections 320 may resemble an interface onto which electrical wires/cables 314 connect to, and then one or more other electrical wires/cables may then connect electrical port connections 320 to one or more of the devices, such as those shown in FIG. 4, that are external to packaged quantum memory device 400. In other embodiments, electrical port connections 320 may resemble a kind of hollow pipe which electrical wires/cables may be wound through. In such embodiments, electrical port connections 320 may connect directly to the one or more of the devices, such as those shown in FIG. 4, that are external to packaged quantum memory device 400. In some embodiments, the cryogenic cooling device 308 may further include chambers or other sealants used to seal the electrical port connections 320 and optical fiber port connections 316. Also, an outer diameter of gas tube connection 318 may be sealed against a surface of one or more components of the cryogenic cooling device to prevent leakage.

In another example, optical fiber cables, such as optical fiber cables 310, may be connected to optical fiber ports 302 and to optical fiber port connections 316. In some embodiments, optical fiber port connections 316 may resemble an interface that optical fiber cables 310 connect to, and subsequently other optical fiber cables may then connect optical fiber port connections 316 to devices intended to interface with optical fiber ports 302, such as the inputs and outputs to optical fiber ports shown in FIG. 4. In other embodiments, optical fiber port connections 316 may resemble a hollow pipe which optical fiber cables 310 may be routed through.

In yet another example, gas tube 304 may be connected to gas tube connection 318 via gas tube 312. In some embodiments, gas tube 312 may resemble a pipe, tube, or hose. In other embodiments, gas tube 312 may resemble a pipe connector, valve, adapter, or other joining piece that couples gas tube 304 to gas tube connection 318. In some embodiments, gas tube connection 318 may resemble a pipe larger in diameter than that of gas tube 304, such that gas tube 304 may be routed through gas tube connection 318 to a gas source, such as gas source 402 shown in FIG. 4. In other embodiments, gas tube connection 318 may resemble a junction which gas tube 304 is connected to (e.g., adapter). Gas tube connection 318 may additionally have one or more valves in order to control the flow of gas into gas tube 304, according to some embodiments. In some embodiments, gas tube connection 318 may be connected to a vacuum pump that is external to cryogenic cooling device 308 in order to control pressure within packaged quantum memory device 300. In such embodiments, gas tube 304 may be connected to the vacuum pump via gas tube connection 318, and gas tube connection 318 may similarly have one or more valves, etc. in order maintain a pressure differential between the pressure inside packaged quantum memory device 300 and the pressure in the environment. Gas tube connection 318 may additionally be configured to perform one or more operations to maintain cryogenic temperatures for cryogenic cooling device 308 (e.g., close/open a valve such that cryogenic cooling device 308 may "pump" down to cryogenic temperatures by changing vacuum and gas environments within the cryogenic cooling device 308).

It should be understood by a person having ordinary skill in the art that the optical fiber port connections 316, gas tube connection 318, and electrical port connections 320 shown in FIG. 3B are meant to provide various example mechanisms by which optical fiber ports 302, gas tube 304, and electrical ports 306 may interface with devices external to cryogenic cooling device 308 and should not be interpreted as being limited to only those examples discussed. For example, optical fiber port connections 316, gas tube connection 318, and electrical port connections 320 may be combined (e.g., bundled) into one input/output interface to cryogenic cooling device 308, and/or may be configured in other variations that allow for the interfacing requirements described herein. Furthermore, materials used to construct optical fiber cables 310, gas tube 312, and electrical wires/cables 314 may be chosen such that said wires, cables, and tubes may withstand cryogenic temperatures without rapid degradation, deformation, or loss of functionality, according to some embodiments. Additionally, optical fiber cables 310 and/or electrical wires/cables 314 may be insulated such that they are more resistant to extreme temperatures, and/or stray magnetic and electric fields that may be present within packaged quantum memory device 300 (e.g., via magnet 124).

Figure 4:
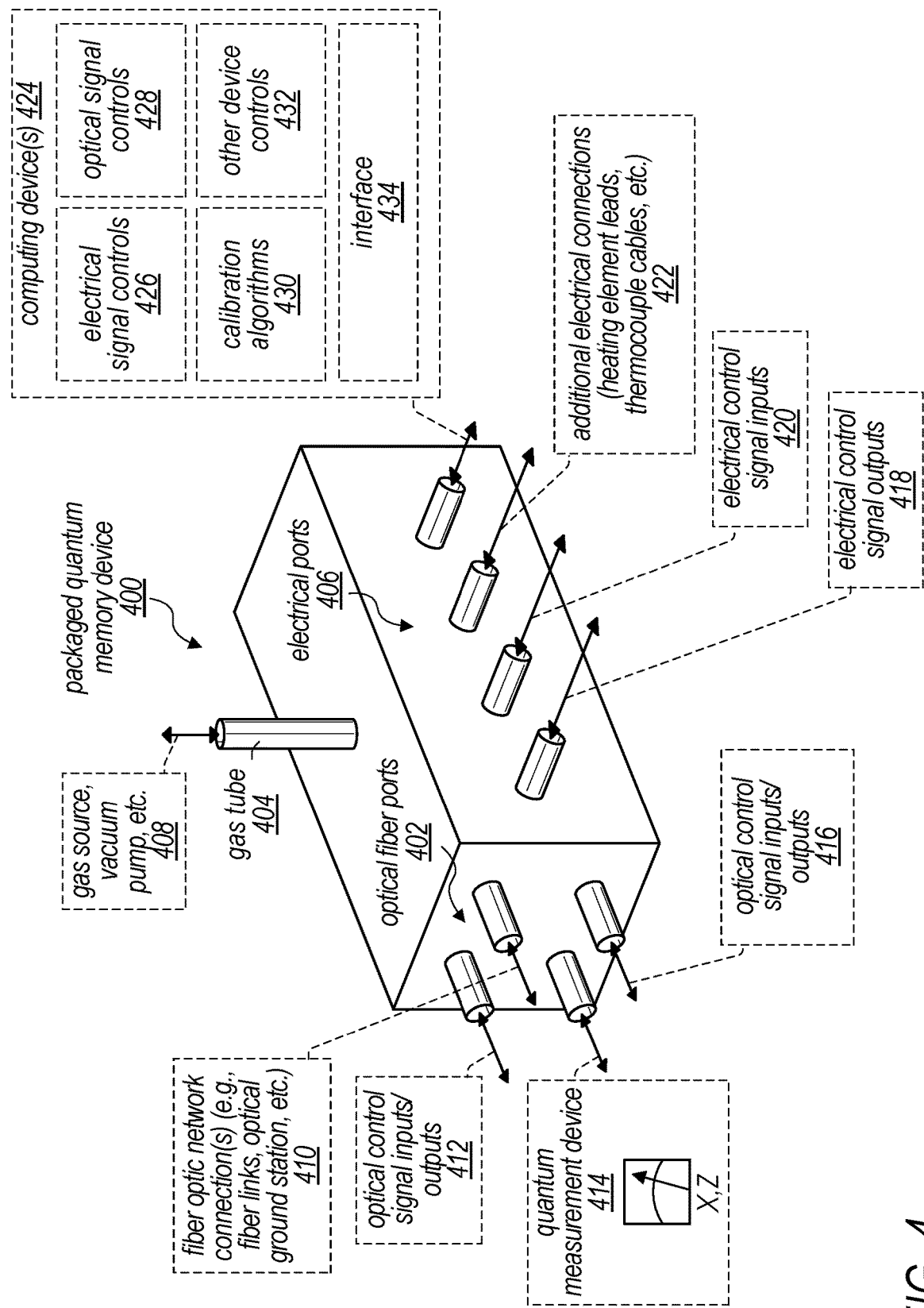
FIG. 4 illustrates example inputs and outputs to a gas tube and to optical and electrical ports of an outer package of a packaged quantum memory device, such as a quantum repeater, according to some embodiments.

FIG. 4 illustrates example inputs and outputs to a gas tube and to optical and electrical ports of the outer package of a packaged quantum memory device, such as a quantum repeater, according to some embodiments.

In some embodiments, optical fiber ports 402, gas tube 404, and electrical ports 406 may be connected to various connectors that send, receive, or otherwise use control signals pertaining to packaged quantum memory device 400. In some embodiments, one or more of the ports may be first connected to a bus (e.g., an I/O bus), and the bus connected to various connectors. Similarly, one or more connectors may be split via wire splitters, bundled together into cables, connected to a breadboard, or otherwise manipulated between connections to optical fiber and electrical ports 402 and 406, and the inputs and outputs shown in FIG. 4. Electrical control signal outputs 418 and electrical control signal inputs 420 may resemble electrical wires/cables 314 as described in FIGS. 3A and 3B. In some embodiments in which packaged quantum memory device 400 is installed within a cryogenic cooling device, such as cryogenic cooling device 308, electrical control signal outputs 418 and electrical control signal inputs 420 may be routed through electrical port connections 320, as described in FIGS. 3A and 3B.

In some embodiments, electrical ports 406 of packaged quantum memory device 400 may be connected to electrical control signal inputs and outputs 418 and 420. Electrical control signal inputs may include control signals that are applied to the control devices for packaged quantum memory device 400 (e.g., those shown in FIG. 1B) in order to manipulate properties of the quantum memories of packaged quantum memory device 400. Electrical ports 406 may also be connected to additional electrical connections 422, which may include the wires for heating element 122, for example. Electrical ports 406 may also be configured to receive measurement information from the quantum memory control devices for packaged quantum memory device 400. For example, in some embodiments, a thermocouple may be placed on interface layer 106 such that the temperature of the quantum memories and/or the environment within outer package 102 may be monitored locally, and electrical ports 406 may therefore be connected to additional electrical connections 422 in order to receive signal outputs from said thermocouple.

One or more electrical ports of electrical ports 406 may additionally be coupled to a data acquisition device, software module, FPGA, or another system that may provide an interface between the hardware components described herein within packaged quantum memory device 400 and software-based controls for packaged quantum memory device 400. In some embodiments, one or more electrical ports of electrical ports 406 may be coupled to one or more computing devices, such as computing device(s) 424. Computing device(s) 424 may resemble computing device 800 and the functionalities for computing device 800 described herein, according to some embodiments. Computing device(s) 424 may include instructions for sending, receiving, interpreting, controlling, manipulating, and/or maintaining electrical and optical signals to/from packaged quantum memory device 400 via electrical signal controls 426 and optical signal controls 428, according to some embodiments. Electrical signal controls 426 and optical signal controls 428 may represent programmable control signals that may be stored, accessed, and edited via computing device(s) 424.

Computing device(s) 424 may additionally store calibration algorithms, such as calibration algorithms 430, that may be used to calibrate one or more components and/or interactions (e.g., coupling) between components of packaged quantum memory device 400. Calibration algorithms 430 may be used during a calibration process of packaged quantum memory device 400, such as the calibration process described in block 606, according to some embodiments. A person having ordinary skill in the art should additionally understand that calibration algorithms 430 may represent calibration algorithms used during an initial installation of packaged quantum memory device 400, but may also represent calibration algorithms used periodically to re-calibrate components of packaged quantum memory device 400 (e.g., deviation detection for the quantum memory control devices, autonomous quantum memory control device adjustments, etc.), and/or calibration algorithms used to reconfigure components of packaged quantum memory device 400 (e.g., when the gas used in gas tube 404 is changed, when the temperature that cryogenic cooling device 308 is set to is changed, etc.). Additionally, calibration algorithms may be used to help provide maintenance to packaged quantum memory device 400 (e.g., for debugging purposes, fault detection, etc.). In some embodiments in which packaged quantum memory device 400 is installed as part of a quantum entanglement provider network, calibration algorithms may be used in order to provide information to a service or maintenance team (e.g., if packaged quantum memory device 400 is installed in a remote location and may require servicing by a technician).

Computing device(s) 424 may also include other device controls 432. For example, other device controls 432 may include algorithms for different configurations of packaged quantum memory device 400 (e.g., different gas flow rates) which may provide customizable installation and usage of packaged quantum memory device 400 for different destination locations and/or applications.

Computing device(s) 424 may also provide an interface, such as interface 434. Interface 434 may be implemented as various types of programmatic (e.g., Application Programming Interfaces (APIs)), command line, and/or graphical user interfaces to support the methods and systems described herein.

In some embodiments, optical fiber ports 402 may be connected to optical control signal inputs and outputs 412 and 416, which may be used to manipulate properties of the quantum memories within packaged quantum memory device 400, as described herein. Optical fiber ports 402 may also be connected to quantum measurement device 414, which may perform joint measurements on entangled particles that are received at packaged quantum memory device 400. Similarly, entangled particles may be received at the quantum memories within packaged quantum memory device 400 via fiber optic network connection(s) 410 in some embodiments in which packaged quantum memory device 400 is part of an optical fiber communications network.

Gas tube 404 may also be connected to a gas source and/or vacuum pump, as shown in connection 408. In some embodiments, a gas source may resemble a gas tank which may flow gas into packaged quantum memory device 400 via gas tube 404. Gas tube 404 may similarly be configured to remove gas from within packaged quantum memory device 400, and/or pump down to a vacuum state. In some embodiments, connection 408 may also include a valve system in order to open and shut off the flow of one gas over another, and/or regulate the flow of gas.

Figure 5:
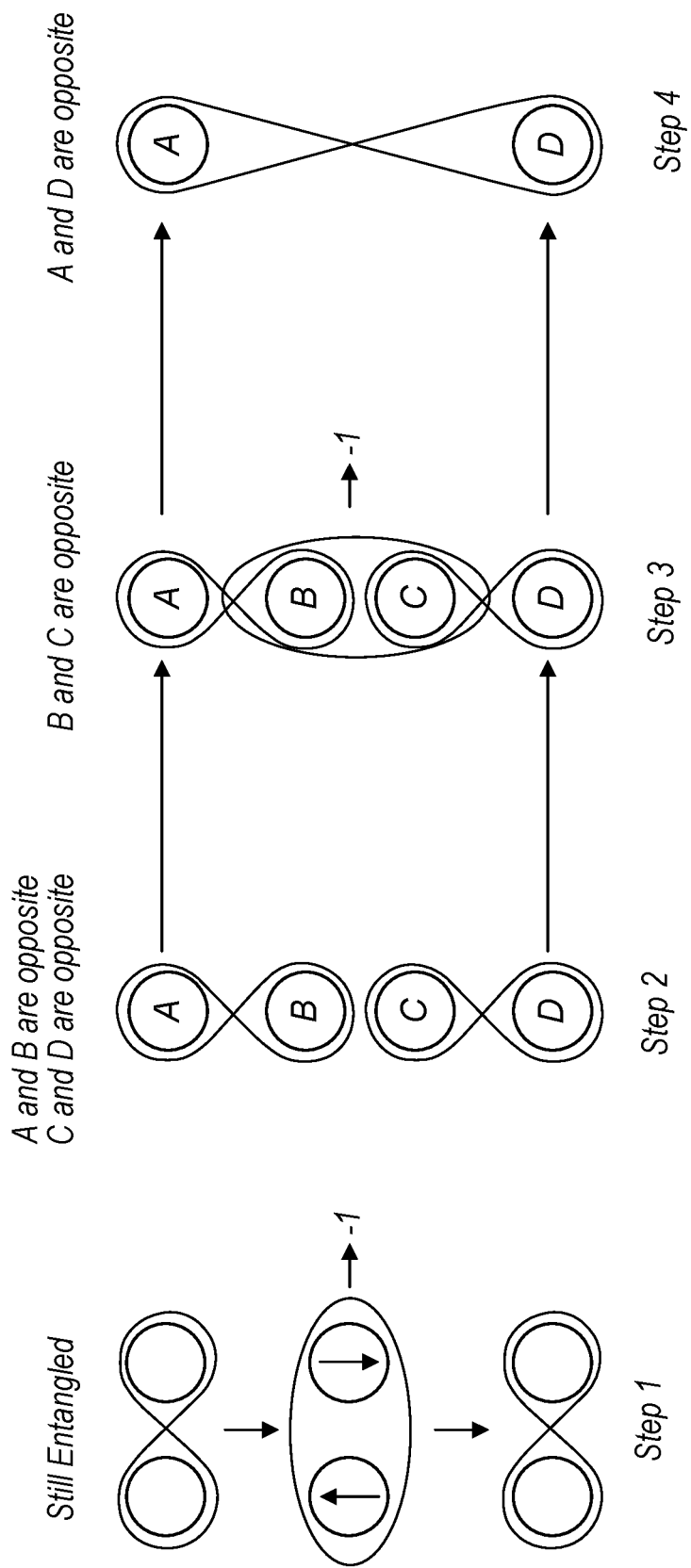
FIG. 5 is an example diagram illustrating how entanglement is extended by performing joint measurements of received particles of respective sets of entangled particles distributed via fiber optic network links to/from quantum memory devices, such as quantum repeaters, according to some embodiments.

FIG. 5 is an example diagram illustrating how entanglement is extended by performing joint measurements of received particles of respective sets of entangled particles distributed via fiber optic network links to/from quantum memory devices, such as quantum repeaters, according to some embodiments.

In some embodiments, joint measurements as shown in FIG. 5 may be performed for photons stored in a packaged quantum memory device, such as packaged quantum memory devices 100, 300, 400, etc. For example, at step 1, a joint measurement is performed that measures two particles (e.g., photons) in such a way as that the joint measurement only determines if the two particles are the same or opposite (e.g., in the same quantum state or not). This is done without revealing information about the individual particles. Then, at step 2, the entangled pairs are defined by their correlations, e.g., opposite or the same. In the example shown in FIG. 5 both A/B and C/D are entangled such that they are opposites. Next, at step 3 a joint measurement is performed on B/C with an outcome (e.g., opposite or same), which is opposite in the example case shown in FIG. 5. This tells A that its compliment is the opposite D's compliment, allowing A and D to infer they are opposites. Then, using this information at step 4 A/D the particles are now entangled such that they are always in the opposite state. In some embodiments, the joint measurements may be performed using a local two-qubit gate between B and C (e.g., a CNOT gate) and may further include measuring each bit individually. This can be understood as an entangling operation and a measurement, or conversely as a single measurement in an "entangled basis." When the joint measurements are performed in this way, the results reveal information about the correlations between particles, such as particles B and C, but not information about the particles themselves. This is due to the entanglement generated by the two-qubit operation. Such joint measurements may be performed at a quantum measurement device, such as quantum measurement device 414, according to some embodiments.

Figure 6:
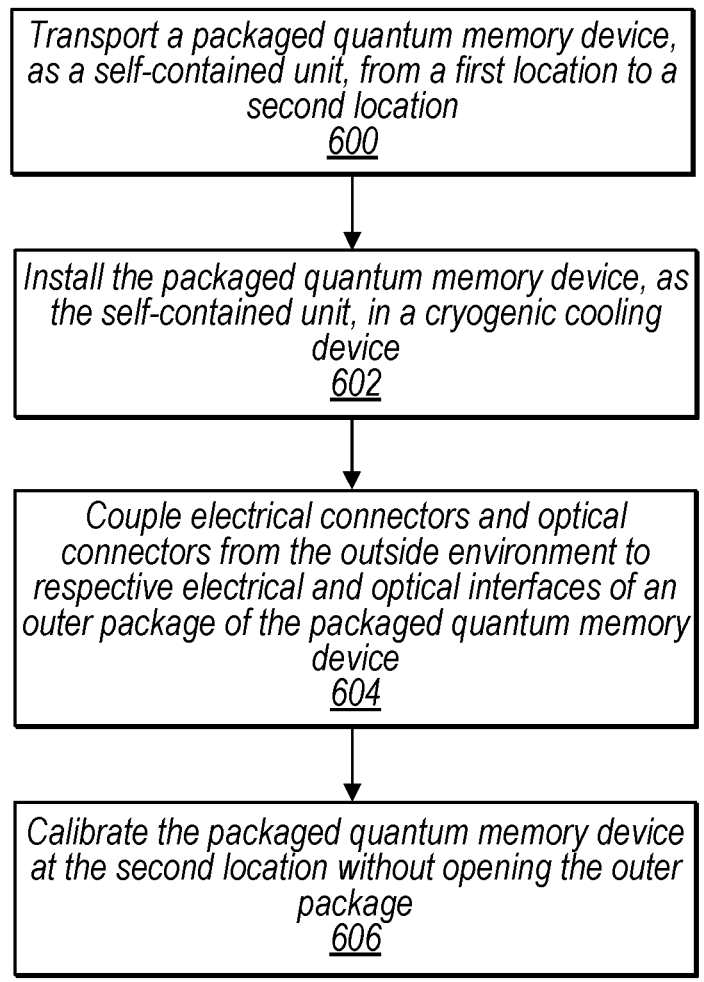
FIG. 6 is a flowchart illustrating a process of transporting and installing a packaged quantum memory device, such as a quantum repeater, at a destination, according to some embodiments.

FIG. 6 is a flowchart illustrating a process of transporting and installing a packaged quantum memory device, such as a quantum repeater, at a destination, according to some embodiments.

In some embodiments, a packaged quantum memory device, such as those described herein (e.g., packaged quantum memory device 100, packaged quantum memory device 300, and packaged quantum memory device 400), may be transported from a first location to a second location, as described in block 600. For example, the first location may represent an assembly location where the packaged quantum memory device has been assembled. In some embodiments, such assembly may also include initial calibration(s) of one or more components within the packaged quantum memory device. The second location may represent a destination location, such as a location within a fiber optic communications network of a service provider (e.g., a communications hub, an optical ground station, a data center, etc.), according to some embodiments. The packaged quantum memory device may also be treated as a self-contained unit, meaning that the packaged quantum memory device may not require re-construction and/or additional assembly of components within outer package 102 upon arrival at the second location. In some embodiments, the packaged quantum memory device may further be moved to a third location, such as from a first installation location to a second, re-deployed, installation location.

In block 602, the packaged quantum memory device is installed, as a self-contained unit, into a cryogenic cooling device. In some embodiments, block 602 may refer to the installation processes described in FIGS. 3A and 3B of packaged quantum memory device 300 into cryogenic cooling device 308. As described for FIGS. 3A and 3B, electrical and optical connectors that have been connected to electrical and optical interfaces of the outer package may be routed through tubes, such as optical fiber port connections 316, gas tube connection 318, and electrical port connections 320. In other embodiments in which optical fiber port connections 316, gas tube connection 318, and electrical port connections 320 represent one or more connection points, processes described in block 602 may be done simultaneously with processes described in block 604 as part of a larger installation process (e.g., multiple packaged quantum memory devices are being installed into a given cryogenic cooling device).

In block 604, electrical and optical connectors may be connected to respective electrical and optical interfaces (e.g., optical fiber and electrical ports) of an outer package (e.g., outer package 102) of the packaged quantum memory device. In some embodiments, such electrical and optical connectors may provide connection points for to the quantum memory control devices described in FIG. 4. Additionally, at block 604, one or more connections may be made to a gas tube of the packaged quantum memory device (e.g., a vacuum pump, a gas tank, etc.). In some embodiments, such electrical and optical connections, as well as gas tube connections, may be made to connectors accessible via the outer package without having to open the outer package.

In block 606, the packaged quantum memory device may be calibrated at the second location, without opening the outer package of the packaged quantum memory device. In some embodiments, such calibrations may resemble at least calibrations of a placement/orientation of a magnet (e.g., magnet 124), calibrations of a thermocouple (e.g., such as a thermocouple attached to heating element leads 152), calibrations pertaining to the coupling of the optical fibers (e.g., optical fibers 134) to the quantum wafer (e.g., quantum wafer 140), and/or calibrations pertaining to the tuning of the quantum wafer with gas from the gas tube (e.g., gas tube 112). In some embodiments, calibrations described in block 606 may resemble calibration algorithms 430 and the description for calibration algorithms 430 herein.

Figure 7:
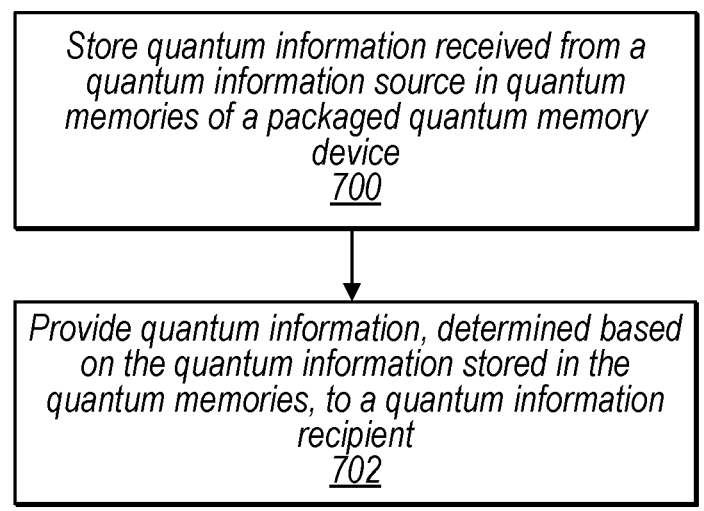
FIG. 7 is a flowchart illustrating a process of storing quantum information in quantum memories of a packaged quantum memory device, such as a quantum repeater, and providing the quantum information to a recipient, according to some embodiments.

FIG. 7 is a flowchart illustrating a process of storing quantum information in quantum memories of a packaged quantum memory device, such as a quantum repeater, and providing the quantum information to a recipient, according to some embodiments.

In block 700, quantum information may be received from a quantum information source and stored in one or more quantum memories of a packaged quantum memory device (e.g., in embodiments in which the packaged quantum memory device may resemble a quantum repeater, and be configured to complete functionalities of a quantum repeater, such as those described herein). In some embodiments, quantum information may resemble one or more entangled particles, such as those described in FIG. 5. In such embodiments, the quantum information may be received via optical fibers, such as optical fibers 134, to a quantum memory, such as quantum memory 200 and other quantum memories on quantum wafer 140. The quantum information source may represent a fiber optic network link, such as those described by fiber optic network connection(s) 410, according to some embodiments.

In block 702, quantum information may be provided to a quantum information recipient. In some embodiments, the quantum information recipient may be an optical fiber network link, such as those described by fiber optic network connection(s) 410. The quantum information recipient may also represent a quantum measurement device, such as quantum measurement device 414, which may perform joint measurements on the quantum information of block 702.

Illustrative Computer System

Figure 8:
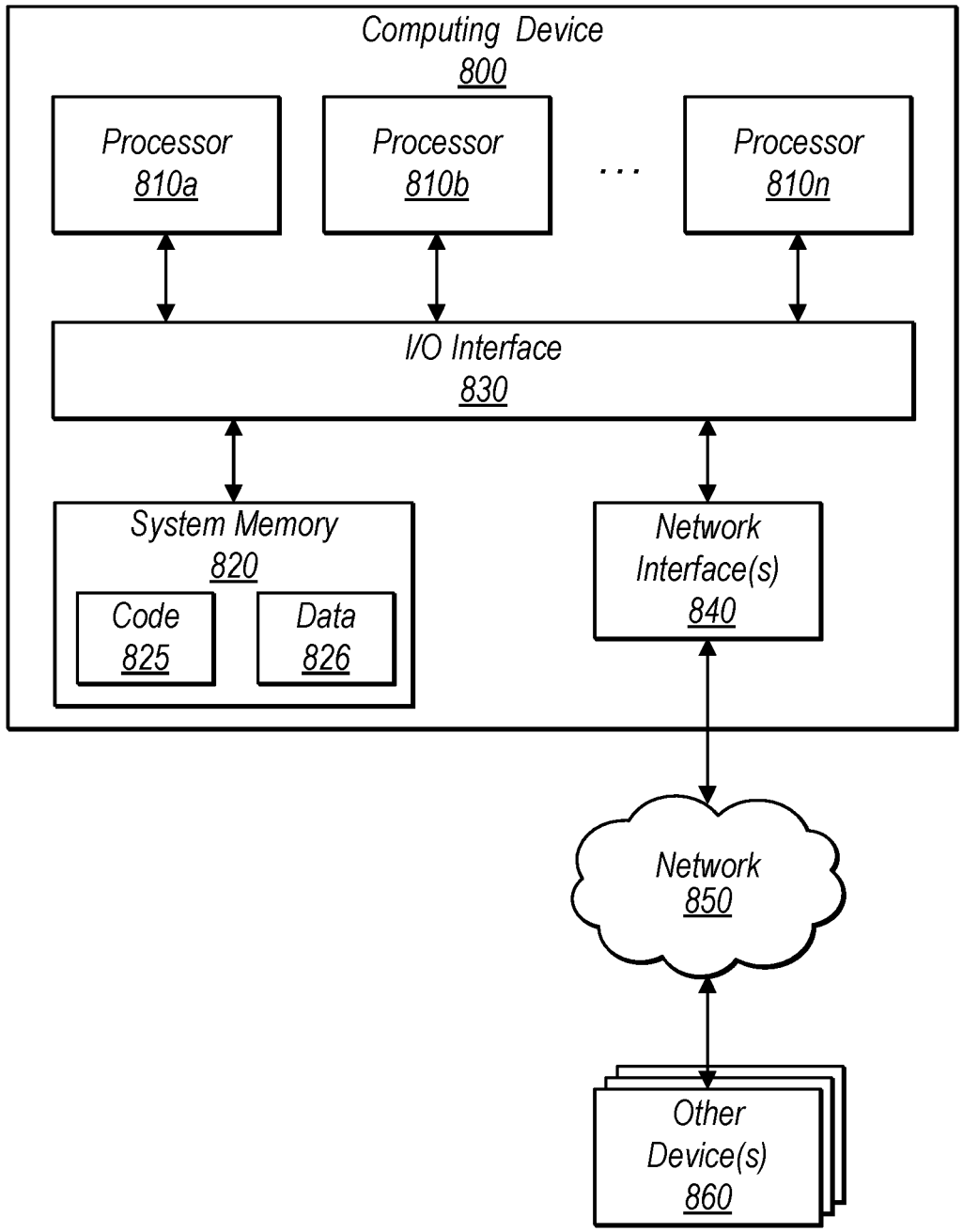
FIG. 8 is a block diagram illustrating an example computing device that may be used in at least some embodiments.

FIG. 8 is a block diagram illustrating an example computing device that may be used in at least some embodiments.

FIG. 8 illustrates such a general-purpose computing device 800 as may be used in any of the embodiments described herein. In the illustrated embodiment, computing device 800 includes one or more processors 810 coupled to a system memory 820 (which may comprise both non-volatile and volatile memory modules) via an input/output (I/O) interface 830. Computing device 800 further includes a network interface 840 coupled to I/O interface 830.

In various embodiments, computing device 800 may be a uniprocessor system including one processor 810, or a multiprocessor system including several processors 810 (e.g., two, four, eight, or another suitable number). Processors 810 may be any suitable processors capable of executing instructions. For example, in various embodiments, processors 810 may be general-purpose or embedded processors implementing any of a variety of instruction set architectures (ISAs), such as the x86, PowerPC, SPARC, or MIPS ISAs, or any other suitable ISA. In multiprocessor systems, each of processors 810 may commonly, but not necessarily, implement the same ISA. In some implementations, graphics processing units (GPUs) may be used instead of, or in addition to, conventional processors.

System memory 820 may be configured to store instructions and data accessible by processor(s) 810. In at least some embodiments, the system memory 820 may comprise both volatile and non-volatile portions; in other embodiments, only volatile memory may be used. In various embodiments, the volatile portion of system memory 820 may be implemented using any suitable memory technology, such as static random access memory (SRAM), synchronous dynamic RAM or any other type of memory. For the non-volatile portion of system memory (which may comprise one or more NVDIMMs, for example), in some embodiments flash-based memory devices, including NAND-flash devices, may be used. In at least some embodiments, the non-volatile portion of the system memory may include a power source, such as a supercapacitor or other power storage device (e.g., a battery). In various embodiments, memristor based resistive random access memory (ReRAM), three-dimensional NAND technologies, Ferroelectric RAM, magnetoresistive RAM (MRAM), or any of various types of phase change memory (PCM) may be used at least for the non-volatile portion of system memory. In the illustrated embodiment, program instructions and data implementing one or more desired functions, such as those methods, techniques, and data described above, are shown stored within system memory 820 as code 825 and data 826.

In some embodiments, I/O interface 830 may be configured to coordinate I/O traffic between processor 810, system memory 820, and any peripheral devices in the device, including network interface 840 or other peripheral interfaces such as various types of persistent and/or volatile storage devices. In some embodiments, I/O interface 830 may perform any necessary protocol, timing or other data transformations to convert data signals from one component (e.g., system memory 820) into a format suitable for use by another component (e.g., processor 810). In some embodiments, I/O interface 830 may include support for devices attached through various types of peripheral buses, such as a variant of the Peripheral Component Interconnect (PCI) bus standard or the Universal Serial Bus (USB) standard, for example. In some embodiments, the function of I/O interface 830 may be split into two or more separate components, such as a north bridge and a south bridge, for example. Also, in some embodiments some or all of the functionality of I/O interface 830, such as an interface to system memory 820, may be incorporated directly into processor 810.

Network interface 840 may be configured to allow data to be exchanged between computing device 800 and other devices 860 attached to a network or networks 850, such as other computer systems or devices as illustrated in FIG. 1A through FIG. 7, for example. In various embodiments, network interface 840 may support communication via any suitable wired or wireless general data networks, such as types of Ethernet network, for example. Additionally, network interface 840 may support communication via telecommunications/telephony networks such as analog voice networks or digital fiber communications networks, via storage area networks such as Fibre Channel SANs, or via any other suitable type of network and/or protocol.

In some embodiments, system memory 820 may represent one embodiment of a computer-accessible medium configured to store at least a subset of program instructions and data used for implementing the methods and apparatus discussed in the context of FIG. 1A through FIG. 7. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computing device 800 via I/O interface 830. A non-transitory computer-accessible storage medium may also include any volatile or non-volatile media such as RAM (e.g., SDRAM, DDR SDRAM, RDRAM, SRAM, etc.), ROM, etc., that may be included in some embodiments of computing device 800 as system memory 820 or another type of memory. In some embodiments, a plurality of non-transitory computer-readable storage media may collectively store program instructions that when executed on or across one or more processors implement at least a subset of the methods and techniques described above. A computer-accessible medium may further include transmission media or signals such as electrical, electromagnetic, or digital signals, conveyed via a communication medium such as a network and/or a wireless link, such as may be implemented via network interface 840. Portions or all of multiple computing devices such as that illustrated in FIG. 8 may be used to implement the described functionality in various embodiments; for example, software components running on a variety of different devices may collaborate to provide the functionality. In some embodiments, portions of the described functionality may be implemented using storage devices, network devices, or special-purpose computer systems, in addition to or instead of being implemented using general-purpose computer systems. The term "computing device", as used herein, refers to at least all these types of devices, and is not limited to these types of devices.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g., SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A quantum repeater, comprising:
a plurality of quantum memories;
one or more quantum memory control devices;
an outer package, wherein:
the plurality of quantum memories are enclosed within the outer package; and
the one or more quantum memory control devices are enclosed within the outer package;

one or more electrical interfaces coupled with the outer package, wherein the one or more electrical interfaces are configured to provide an interface between a device outside of the outer package and the one or more quantum memory control devices located within the outer package; and one or more optical interfaces coupled with the outer package, wherein at least one of the one or more optical interfaces is configured to:
- receive a photon to be stored in a given one of the quantum memories from a source outside of the outer package; or
- provide a photon to a recipient outside of the outer package, wherein the provided photon communicates information stored in a given one of the quantum memories.

2. The quantum repeater of claim 1, wherein:
the quantum repeater is configured to be transported from one location to another location as a unit, and
the plurality of quantum memories and the one or more quantum memory control devices are configured to remain enclosed in the outer package while the quantum repeater is being transported from the one location to the other location.

3. The quantum repeater of claim 2, wherein the one or more quantum memory control devices are configured to:
provide quantum memory control to the plurality of quantum memories at a destination location, subsequent to the quantum repeater being transported to the destination location, without the one or more quantum memory control devices being removed from the outer package for calibration.

4. The quantum repeater of claim 3, wherein the quantum repeater is configured to be installed, as a unit, in a cryogenic cooling device at the destination location.

5. An apparatus, comprising:
one or more quantum memories;
one or more quantum memory control devices configured to control environmental conditions experienced by the one or more quantum memories or modify one or more properties of a quantum memory layer comprising the one or more quantum memories; and
an outer package, wherein:
- the one or more quantum memories are enclosed within the outer package; and
- the one or more quantum memory control devices are enclosed within the outer package.

6. The apparatus of claim 5, wherein the one or more quantum memory control devices are configured to control:
a magnetic field that interacts with the one or more quantum memories;
strain applied to one or more cavities of the quantum memory layer within which the one or more quantum memories are located; or
a temperature of the one or more quantum memories.

7. The apparatus of claim 5, further comprising:
the quantum memory layer, wherein the one or more quantum memories are included in the quantum memory layer; and
an interface layer, wherein:
- the one or more quantum memory control devices are coupled to the interface layer; and
- the interface layer is configured to route electrical signals and optical signals between devices external to the outer package and the quantum memory layer.

8. The apparatus of claim 7, wherein the interface layer is further configured to:
direct gas, via a gas tube extending outside of the outer package, toward the quantum memory layer; and
flow gas, via the gas tube, away from the quantum memory layer in response to a vacuum being applied to the gas tube.

9. The apparatus of claim 7, wherein the quantum memory layer comprises a plurality of quantum memories, and
wherein the interface layer provides a common interface layer for the plurality of quantum memories of the quantum memory layer.

10. The apparatus of claim 5, further comprising:
one or more electrical interfaces coupled with the outer package, wherein the one or more electrical interfaces are configured to provide an interface between a device outside of the outer package and the one or more quantum memory control devices located within the outer package; and one or more optical interfaces coupled with the outer package, wherein at least one of the one or more optical interfaces is configured to:
- receive a photon to be stored in a given one of the quantum memories from a source outside of the outer package; or
- provide a photon to a recipient outside of the outer package, wherein the provided photon communicates information stored in a given one of the quantum memories, wherein, based on control signals received via the one or more electrical interfaces or the one or more optical interfaces, the one or more quantum memory control devices are configured to adjust, without opening the outer package, tuning of one or more cavities comprising the one or more quantum memories.

11. The apparatus of claim 5, further comprising:
a magnet mounted within the outer package, wherein the magnet provides a magnetic field for the one or more quantum memories.

12. The apparatus of claim 11, further comprising:
a magnet holding layer mounted above the one or more quantum memories; and
piezoelectric rods coupled to the magnet holding layer,
wherein the piezoelectric rods are configured to expand or contract to adjust a positioning or orientation of the magnet relative to the one or more quantum memories, based on electrical control signals provided via an electrical interface coupled to the outer package.

13. The apparatus of claim 5, wherein the outer package is further configured to:
maintain environmental conditions for the one or more quantum memories and the one or more quantum memory control devices that are enclosed within the outer package, wherein at least one of the environmental conditions is different than atmospheric conditions outside of the outer package.

14. The apparatus of claim 5, further comprising:
one or more electrical interfaces coupled with the outer package, wherein:
- the one or more electrical interfaces are configured to provide an interface between a device outside of the outer package and the one or more quantum memory control devices located within the outer package; and
- at least one of the one or more electrical interfaces is configured to:
  - couple with a computing device external to the outer package; and
  - provide measurement information from the one or more quantum memory control devices to the external computing device and/or receive control signals for controlling the one or more quantum memory control devices from the external computing device.

15. The apparatus of claim 5, wherein the outer package comprises an insulation layer configured to:
shield components enclosed within the outer package from stray magnetic and electric fields; and
provide thermal insulation to the components enclosed within the outer package.

16. A method comprising:
storing quantum information received from a quantum information source in one or more quantum memories of a packaged quantum memory device, wherein the packaged quantum memory device comprises:
the one or more quantum memories;
one or more quantum memory control devices configured to control environmental conditions experienced by the one or more quantum memories or modify one or more properties of a quantum memory layer comprising the one or more quantum memories; and
an outer package, wherein:
the one or more quantum memories are enclosed within the outer package; and
the one or more quantum memory control devices are enclosed within the outer package; and
providing quantum information determined based on the quantum information stored in the one or more quantum memories to a quantum information recipient.

17. The method of claim 16, further comprising:
transporting the packaged quantum memory device, as a self-contained unit, from a first location to a second location.

18. The method of claim 17, further comprising:
installing the packaged quantum memory device, as the self-contained unit, in a cryogenic cooling device.

19. The method of claim 18, further comprising:
coupling one or more electrical connectors to one or more electrical interfaces of the outer package; and
coupling one or more optical connectors to one or more optical interfaces of the outer package.

20. The method of claim 19, further comprising:
calibrating the packaged quantum memory device at the second location without opening the outer package.

\* \* \* \* \*